United States Patent
Ring et al.

(10) Patent No.: US 6,806,198 B1
(45) Date of Patent: Oct. 19, 2004

(54) GAS-ASSISTED ETCH WITH OXYGEN

(75) Inventors: Rosalinda M. Ring, Hillsboro, OR (US); Susan Xia Li, Fremont, CA (US); Richard Blish, II, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 235 days.

(21) Appl. No.: 09/864,666

(22) Filed: May 23, 2001

(51) Int. Cl.[7] .................. H01L 21/302; H01L 21/3065; C09K 13/00
(52) U.S. Cl. ...................... 438/706; 438/712; 252/79.1; 216/33; 156/345
(58) Field of Search ................................ 438/712, 706; 216/66; 156/345; 252/79.1

(56) References Cited

U.S. PATENT DOCUMENTS

| | | | |
|---|---|---|---|
| 4,851,097 A | * 7/1989 | Hattori et al. | 204/192.33 |
| 5,140,164 A | * 8/1992 | Talbot et al. | 250/492.2 |
| 5,518,595 A | * 5/1996 | Yamakage | 204/192.34 |
| 6,210,981 B1 | * 4/2001 | Birdsley et al. | 438/9 |
| 6,407,001 B1 | * 6/2002 | Scott | 438/712 |
| 6,509,276 B2 | * 1/2003 | Scott | 438/712 |
| 6,580,072 B1 | * 6/2003 | Chang et al. | 250/297 |

OTHER PUBLICATIONS

K. Edinger, "Gas Assisted Etching of Copper with Focused Ion Beams", J. Vac. Sci. Technol., Nov./Dec. 1999.

* cited by examiner

Primary Examiner—Nadine G. Norton
Assistant Examiner—Lynette T. Umez-Eronini

(57) ABSTRACT

Gas-assisted etching (GAE) for integrated circuit dies is enhanced via a method and system that enable halide-assisted etching of dies having copper material. According to an example embodiment of the present invention, an integrated circuit die having copper is etched using a focused ion beam (FIB) and a halide etch gas, such as chlorine. A selected amount of oxygen-containing gas is supplied to the die to react with the halide and prevent the corrosion of exposed copper material in the die. In this manner, the benefits of halide-assisted etching are realized while inhibiting the corrosion of copper that typically occurs with integrated circuit dies having copper material.

14 Claims, 4 Drawing Sheets

US 6,806,198 B1

GAS-ASSISTED ETCH WITH OXYGEN

FIELD OF THE INVENTION

The present invention relates generally to semiconductor devices and their fabrication and, more particularly, to semiconductor devices and their manufacture involving techniques for manufacturing, analyzing and debugging circuitry within an integrated circuit die.

BACKGROUND OF THE INVENTION

Recent technological advances in the semiconductor industry have permitted dramatic increases in circuit density and complexity, and commensurate decreases in power consumption and package sizes for integrated circuit devices. Single-chip microprocessors now include many millions of transistors operating at speeds of hundreds of millions of instructions per second to be packaged in relatively small, air-cooled semiconductor device packages. A byproduct of these technological advances has been an increased demand for semiconductor-based products, as well as increased demand for these products to be fast, reliable, and inexpensive. These and other demands have led to increased pressure to manufacture a large number of semiconductor devices at an efficient pace while increasing the complexity and improving the reliability of the devices.

As the manufacturing processes for semiconductor devices and integrated circuits increase in difficulty, methods for manufacturing, testing and debugging these devices become increasingly important. Not only is it important to ensure that individual chips are functional, it is also important to ensure that batches of chips perform consistently. In addition, the ability to detect a defective manufacturing process early is helpful for reducing the possibility of manufacturing a defective device. It is also helpful to be able to perform the manufacture, testing and debugging of integrated circuits in an efficient and timely manner.

Many commonly-used semiconductor processes include using a focused ion beam (FIB) in the presence of a gas to perform gas-assisted etching (GAE). In GAE, a gas is introduced to a surface of a die, and an ion beam is directed at a portion of the surface to be etched. The FIB, in the presence of the gas, causes the removal of substrate near the portion of the die, and is useful for milling various types of materials in a semiconductor die. However, the type of gas that is used for GAE is not always compatible with different types of semiconductor materials. For example, when aluminum is milled, chlorine or other halides, such as bromine or iodine, are often used for GAE. If these halides are present during a subsequent copper milling operation, spontaneous reaction (e.g., halide gas reacting with copper spontaneously and without ion beam induction) and/or other corrosion typically occurs in areas having exposed copper. This presents a particularly challenging issue when using a selected FIB GAE arrangement for aluminum, and using the same arrangement for copper thereafter. Halide gas remaining in the FIB GAE arrangement can cause react with the copper and cause corrosion.

For these and other reasons, a method and system for FIB GAE of IC devices that address these challenges would be beneficial.

SUMMARY OF THE INVENTION

The present invention is directed to a method and system for GAE of an integrated circuit die involving an FIB application. A particular aspect of the present invention is directed to providing the ability to efficiently process semiconductor wafers in an environment that is flexible for use with various types of semiconductor materials. The present invention is exemplified in a number of implementations and applications, some of which are summarized below.

According to an example embodiment, the present invention is directed to a method for focused ion beam (FIB) gas-assisted etching (GAE) of an integrated circuit die. An etch gas including a halide gas is supplied to the die. An ion beam, (e.g., using a FIB system) is directed at a selected portion of the die and, using the etch gas and the ion beam, the die is etched. While etching the die, sufficient oxygen is supplied to the die to inhibit corrosion of a portion of the copper in the die being exposed to the etch gas. This method of etching addresses problems discussed hereinabove as well as other problems associated with etching integrated circuit dies, and particularly improves the applicability of halide gas to the etching of dies having copper circuitry.

According to another example embodiment of the present invention, a system is adapted for FIB GAE etching of an integrated circuit die having copper circuitry. The system includes an etch gas supply adapted to supply etch gas, including a halide gas, to the die. An oxygen supply is adapted to supply sufficient oxygen to the die to inhibit corrosion of a portion of the copper in the die being exposed to the etch gas. A FIB device is adapted to direct a FIB at a selected portion of the die and, using the etch gas and the FIB, to etch the die.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
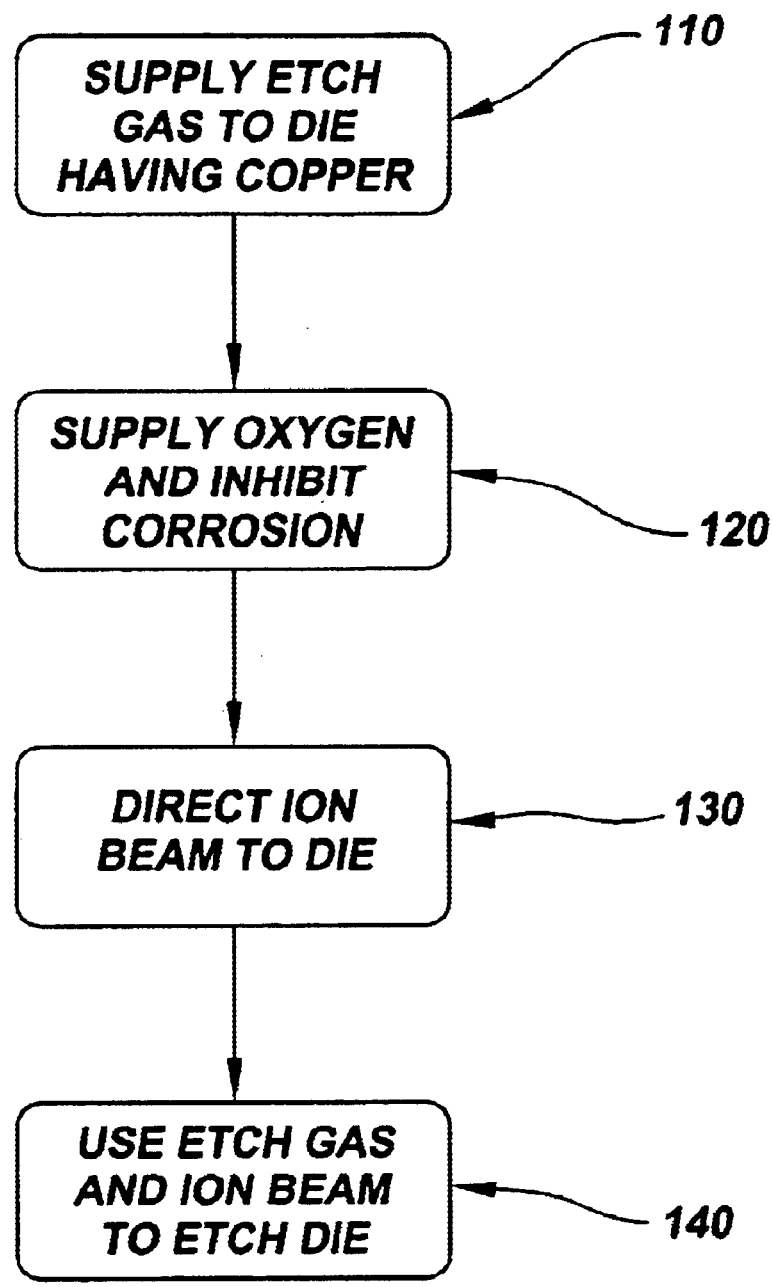
FIG. 1A is a flow diagram for analyzing a semiconductor die, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable for a variety of different types of semiconductor devices, and the invention has been found particularly suited for integrated circuit dies benefiting from GAE with FIB applications. While the present invention is not necessarily limited to such applications, various aspects of the invention may be appreciated through a discussion of various examples using this context.

According to an example embodiment of the present invention, a gas including oxygen, such as pure oxygen, nitrous oxide or ozone, is used during FIB GAE of copper in an integrated circuit die. When halides such as chlorine are used in a FIB milling system, the milling of copper in the same system results in copper corrosion. The corrosion occurs during the etch process, and can occur for many hours, at times up to and exceeding 24 hours, after the use of the halide. For example, when chloride is present in a FIB vacuum chamber, chlorides of copper ($CuCl_x$) can form when a die having copper is processed in the chamber. It has been discovered that, by introducing oxygen-containing gas into a FIB chamber during halide-assisted etching, corrosion of the copper is inhibited. Sufficient oxygen is supplied to remove some or all halide (e.g., chlorine, bromine and/or iodine) from selected portions of the die, such as an exposed surface of the die, and the oxygen effectively acts as a gettering agent. The removal is enhanced by oxygen's chemical affinity for such halides. In this manner, a single FIB chamber can be used for the milling of copper during and/or after halide-assisted etching of copper, aluminum or other material in the chamber, and without necessarily waiting between milling processes.

The supply of oxygen-containing gas is selected as a function of the halide gas being supplied, the ion beam, the die being etched and the desired characteristics of the etch process. Each of these parameters, as well as others, can be considered when selecting etch conditions. For example, during common halide-assisted FIB etching, the die is placed in a vacuum chamber and a vacuum is drawn on the chamber. For typical applications, it has been discovered that maintaining an oxygen gas supply in the chamber to provide a chamber pressure of between about 5–10 micro Torr sufficiently inhibits the corrosion of copper in a typical integrated circuit die. When the inhibition of corrosion is of higher importance, additional oxygen can be supplied. In addition, the type of halide gas, the amount of exposed copper, the vacuum chamber or the type of FIB being used may benefit from similar variances in oxygen supply.

In another example embodiment of the present invention, a sufficient amount of oxygen-containing gas to be supplied is determined by first etching one or more test dies and determining a gas level that is associated with an acceptable level of copper corrosion, given selected etch conditions. This may, for example, include determining a selected pressure to maintain in a particular type of vacuum chamber, determining a nozzle position and/or size, or determining another characteristic related to one or more vacuum chamber conditions. Once a standard set of oxygen-containing gas supply parameters are established for a particular type of die, the parameters are used to select gas supply and other characteristics for the die being analyzed.

The amount of halide present at the die affects the etch characteristics. In a more particular example embodiment of the present invention, the amount of halide resident in the chamber is detected and used to select a corresponding amount of oxygen to be supplied to the chamber to sufficiently inhibit reaction of copper material with the halide. The detected level of halide is compared with a reference level of halide known to result in an acceptable level of corrosion of copper material when used in combination with an oxygen supply having particular characteristics. In one implementation, the detected level of halide is used to determine whether the die should be etched at all. In other words, when the detected level is below a threshold level defined as a function of the die, the die is etched.

FIG. 1A is a flow diagram for halide-assisted etching an integrated circuit die having copper, such as described herein, according to another example embodiment of the present invention. At block 110, and etch gas is supplied to a die having copper circuitry. Oxygen is supplied to the die at block 120, the supply being adapted to sufficiently inhibit corrosion of exposed copper circuitry. At block 130, an ion beam is directed at the die and used in combination with the halide gas to etch a selected portion of the die at block 140.

Figure 1B:
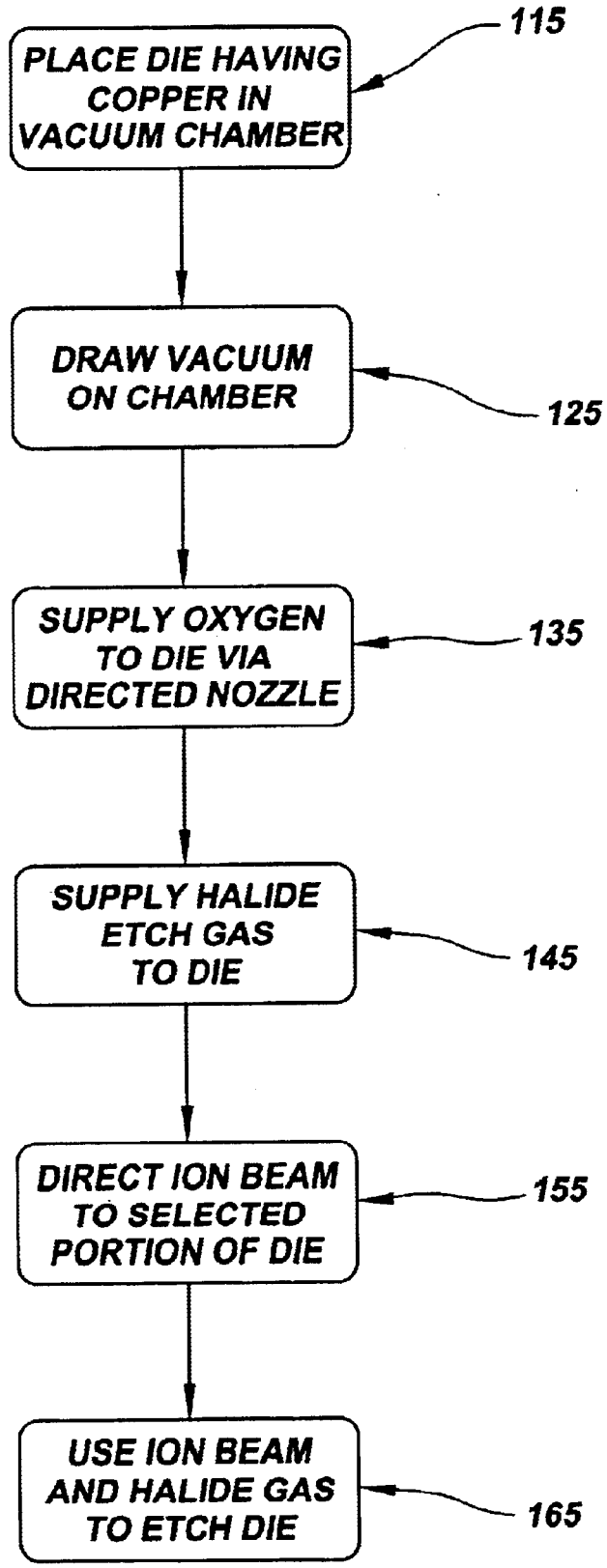
FIG. 1B is another flow diagram for analyzing a semiconductor die, according to another example embodiment of the present invention.

FIG. 1B is another flow diagram for halide-assisted etching an integrated circuit die having copper, according to a more particular example embodiment of the present invention. At block 115, a die having copper is placed in a vacuum chamber, and a vacuum is drawn on the chamber at block 125. Oxygen is supplied to the chamber via opening a valve supplying an outlet having a nozzle directed at a selected portion of the die at block 135. The oxygen nozzle is directed at a portion of the die that has or will have exposed copper during etch. Halide gas is then supplied to the die at block 145, and an ion beam is directed to a portion of the die to be etched at block 155. The ion beam and the halide gas are used in a GAE process to etch a portion of the die at block 165, and the oxygen supply, at block 135, is used to inhibit corrosion of exposed portions of the die that include copper.

Figure 2:
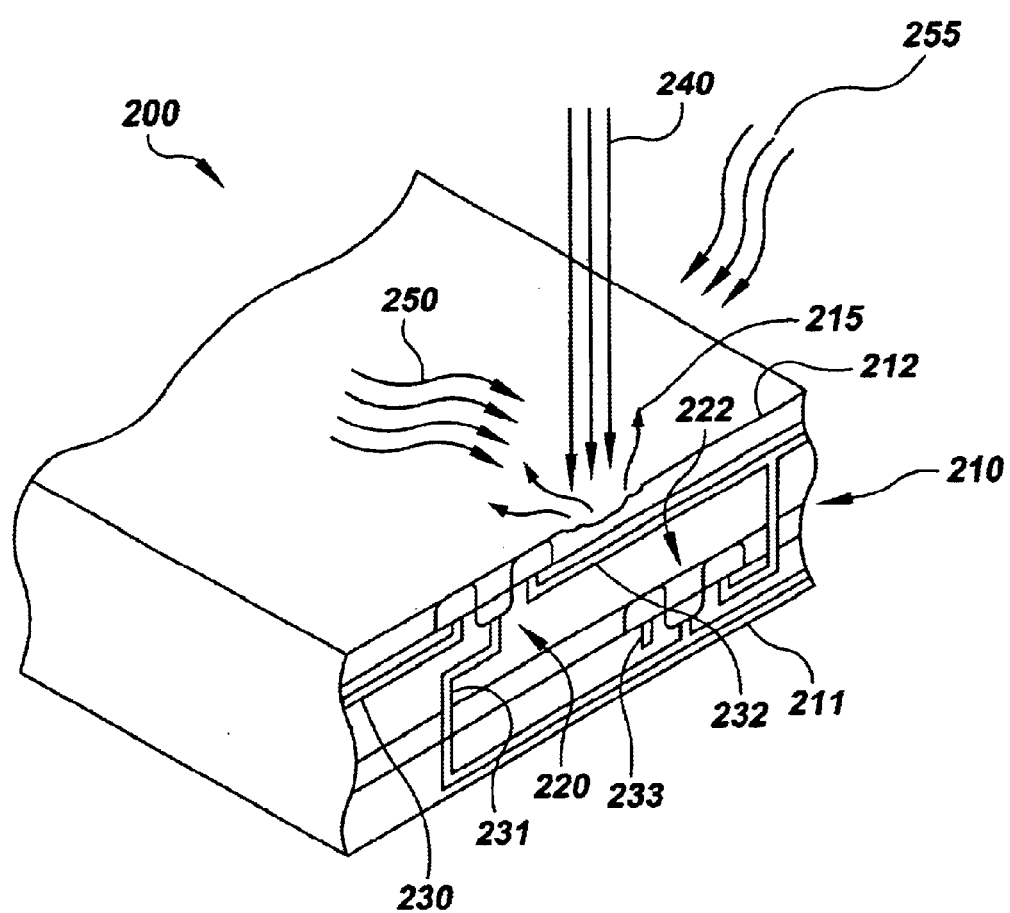
FIG. 2 is a semiconductor die undergoing analysis, according to an example embodiment of the present invention.

The application of oxygen during halide etch of an integrated circuit die is useful for inhibiting corrosion in a variety of types of semiconductor dies. For instance, FIG. 2 shows a cross-section of a flip-chip type integrated circuit die 200 undergoing analysis, according to another example embodiment of the present invention. An etch gas 250 including a halide gas is supplied to the die while an ion beam 240 is directed to a portion of a back side 212 of the die to be etched. In an alternate example embodiment, the ion beam is directed to a circuit side 211 of the die and used to remove material therefrom. In the shown back side application, the gas and ion beam react with material in the back side and a portion 215 of the back side is removed. The etching may, for example, be used to globally etch a layer of material across some or all of the back side, may be used to etch a local opening to a portion of circuitry in the die.

The die 200 has various circuitry in a circuit side 210 including transistors 220 and 222, and interconnects 230, 231, 232 and 233. As the die is etched, one or more of these and other circuit elements may be exposed to the halide etch gas. For instance, when an entire layer of the die is delineated, copper metal lines in the layer are exposed to the etch gas. In addition, when the die is cross-sectioned for analysis, metal lines, such as those shown in FIG. 2, are exposed to the etch gas. As the halide gas 250 is supplied to the die, oxygen 255 is also supplied to the die. The oxygen supply is selected to combine with the halide gas and acts as a gettering agent. Specifically, the oxygen combines with the halide to inhibit corrosion of exposed copper material. Once the die is etched and a selected portion of the die exposed, testing, analysis or other procedures are performed and are uninhibited by corrosion that would occur to the copper if the oxygen is absent.

Figure 3:
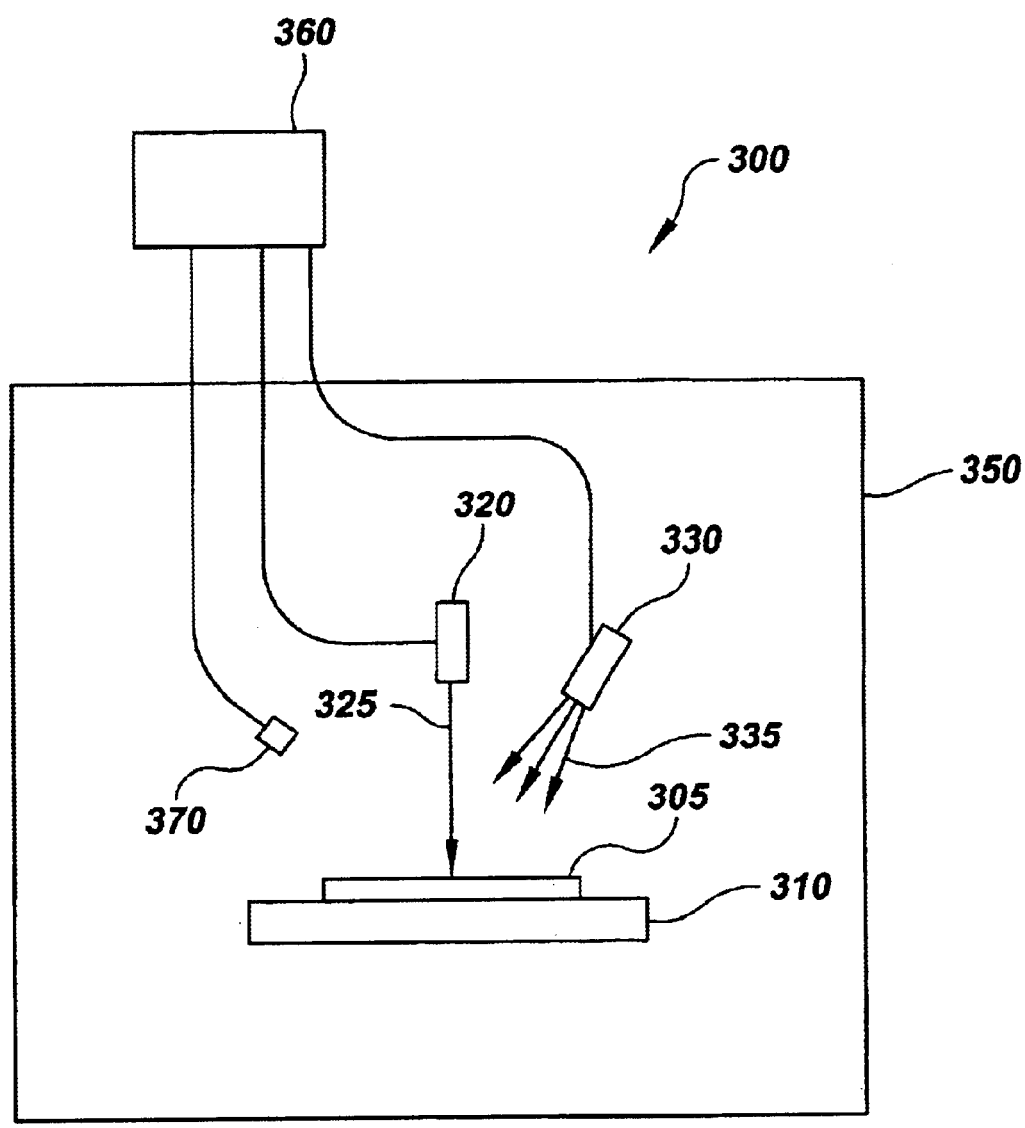
FIG. 3 is a system for analyzing a semiconductor die, according to another example embodiment of the present invention.

FIG. 3 shows a system 300 adapted for halide-assisted etching of an integrated circuit die having copper, according to another example embodiment of the present invention.

The system includes a stage 310 adapted to hold a die 305. A FIB device 320, such as a device available from FEI Company at 7451 NW Evergreen Parkway in Hillsboro, Oreg. is adapted to direct an ion beam 325 at a selected portion of the die. A gas supply 330 is adapted to supply a gas 335 including an etch gas and oxygen to the die in a manner that inhibits corrosion of copper portions of the die during etch. The ion beam, stage and gas supply are located in a vacuum chamber 350 adapted to draw a vacuum inside the chamber.

In an alternate example embodiment of the present invention, the gas supply 330 is split into two supplies: a halide etch gas supply and an oxygen-containing gas supply. The oxygen-containing gas supply includes a nozzle adapted to direct the gas at a selected portion of the die having exposed copper material and that is also exposed to the halide etch gas. The nozzle size and direction are adjustable to effect a selected oxygen supply that meets corrosion inhibition needs of a particular die being etched.

In another alternate example embodiment of the present invention, the FIB device and gas supply 330 are further coupled to a controller 360. A halide level detector 370 is adapted to detect the level of halide in the chamber and provide a signal representing that level to the controller 360. The detector 370 may, for example, include a spectrometer (e.g., diffraction grating and light detector) that is adapted to be used in connection with characteristic emission and absorption lines for halides, or a detector available in the Optima 9125 system from Luxtron of Santa Clara, Calif. The controller, such as a computer, comparator and/or metering valve, is adapted to use the signal to control the amount of etch gas and oxygen supplied to the chamber, and to control the FIB, such as by delaying the start of an etch process until the detected halide level is below a selected threshold.

While the present invention has been described with reference to several particular example embodiments, those skilled in the art will recognize that many changes may be made thereto without departing from the spirit and scope of the present invention, which is set forth in the following claims.

What is claimed is:

1. A method for focused ion beam (FIB) gas-assisted etching (GAE) of an integrated circuit die having copper the method comprising:

supplying etch gas, including a halide gas, to the die;

etching a selected portion of the die using the etch gas and an ion beam directed at the selected portion; and while etching the die, supplying sufficient oxygen-containing gas to the die to inhibit corrosion of a portion of the copper in the die being exposed to the etch gas.

2. The method of claim 1, wherein etching the die includes using a vacuum chamber.

3. The method of claim 2, wherein supplying sufficient oxygen-containing gas includes opening an oxygen-containing gas valve to an oxygen-containing gas supply outlet in the vacuum chamber and maintaining a selected pressure in the chamber.

4. The method of claim 3, prior to etching the die, further comprising etching a test die in the chamber, the test die having similar copper structure to the die to be etched, and determining therefrom a selected pressure to maintain via the oxygen-containing gas supply that prohibits corrosion of the copper.

5. The method of claim 3, wherein the pressure in the chamber is maintained between about 5.0e–6 and 1.0e–5 Torr.

6. The method of claim 3, further comprising attaching a nozzle to the oxygen-containing gas supply outlet, the nozzle being adapted to direct oxygen-containing gas to a selected portion of the die during etching.

7. The method of claim 1, wherein supplying the etch gas includes supplying sufficient oxygen to the die to inhibit corrosion of a portion of the copper in the die being exposed to the etch gas.

8. The method of claim 1, wherein the halide gas includes at least one of: chlorine, bromine and iodine.

9. The method of claim 1, wherein the die includes a flip-chip type die having circuitry in a circuit side opposite a back side, and wherein etching the die includes at least one of: etching the die from the circuit side and etching the die from the back side.

10. The method of claim 1, wherein supplying sufficient oxygen-containing gas includes using oxygen as a gettering agent.

11. The method of claim 1, further comprising detecting a level of halide in the chamber prior to etching the die with an ion beam, wherein etching the die includes etching in response to the detected halide level being below a threshold level defined as a function of the die, the etching and the supplying of oxygen-containing gas.

12. The method of claim 1, further comprising detecting a level of halide in the chamber prior to supplying sufficient oxygen-containing gas to the die, wherein supplying sufficient oxygen-containing gas includes supplying an amount of oxygen in response to the detected halide level.

13. The method of claim 11, wherein the threshold level of halide is selected such that levels of halide below the threshold level produce an amount of corrosion with copper in the die that is below an acceptable design amount.

14. The method of claim 1, wherein supplying sufficient oxygen-based gas includes supplying a gas selected from the group of: oxygen, nitrous-oxide and ozone.

* * * * *

UNITED STATES PATENT AND TRADEMARK OFFICE
CERTIFICATE OF CORRECTION

PATENT NO. : 6,806,198 B1
DATED : October 19, 2004
INVENTOR(S) : Ring et al.

It is certified that error appears in the above-identified patent and that said Letters Patent is hereby corrected as shown below:

Column 5,
Line 43, "copper" should read -- copper, --.

Column 6,
Claims 22 and 23 are missing:
22. The method of claim 1, further including analyzing the die after supplying suffcient oxygen-containing gas to the die.
23. The method of claim 22, further including obtaining results in response to analyzing the die, and using the obtained results to manufacture additional semiconductor devices.

Signed and Sealed this

Nineteenth Day of April, 2005

JON W. DUDAS
*Director of the United States Patent and Trademark Office*